(12) United States Patent
Hebenstreit

(10) Patent No.: US 8,989,680 B2
(45) Date of Patent: Mar. 24, 2015

(54) DETERMINING A STATE OF A RECEIVER ON A TRANSMISSION LINE

(75) Inventor: Andreas Hebenstreit, Egling a. d. Paar (DE)

(73) Assignee: Infineon Technologies AG, Neubiberg (DE)

( * ) Notice: Subject to any disclaimer, the term of this patent is extended or adjusted under 35 U.S.C. 154(b) by 1613 days.

(21) Appl. No.: 12/017,526

(22) Filed: Jan. 22, 2008

(65) Prior Publication Data

US 2008/0174298 A1      Jul. 24, 2008

(30) Foreign Application Priority Data

Jan. 22, 2007   (DE) .......................... 10 2007 003 230

(51) Int. Cl.
  *H04B 1/04*    (2006.01)
  *H04L 12/26*   (2006.01)
  *G01R 31/02*   (2006.01)

(52) U.S. Cl.
  CPC ............ *H04L 43/0811* (2013.01); *G01R 31/02* (2013.01)
  USPC ............ 455/114.2; 361/42; 361/45; 361/115; 361/58

(58) Field of Classification Search
  CPC .............................. H04B 1/0475; H04B 1/525
  USPC ....................... 455/114.2; 361/42, 45, 115, 58
  See application file for complete search history.

(56) References Cited

U.S. PATENT DOCUMENTS

| | | | | |
|---|---|---|---|---|
| 3,999,117 A | * | 12/1976 | Gyugyi et al. | 323/211 |
| 4,556,990 A | * | 12/1985 | Hasler | 455/333 |
| 4,727,337 A | * | 2/1988 | Jason | 330/298 |
| 5,172,062 A | | 12/1992 | Eisermann | |
| 5,477,150 A | * | 12/1995 | Ham et al. | 324/536 |
| 5,539,388 A | * | 7/1996 | Modgil | 340/3.2 |
| 5,986,860 A | * | 11/1999 | Scott | 361/42 |
| 6,121,777 A | | 9/2000 | Hartwig | |
| 6,825,693 B2 | | 11/2004 | Schoenborn et al. | |
| 6,930,610 B2 | * | 8/2005 | Gao et al. | 340/635 |
| 7,030,627 B1 | | 4/2006 | Ashley | |
| 2005/0093575 A1 | | 5/2005 | Schoenborn et al. | |
| 2005/0104623 A1 | | 5/2005 | Guo et al. | |
| 2006/0230211 A1 | | 10/2006 | Woodral | |
| 2007/0239387 A1 | * | 10/2007 | Douriet et al. | 702/117 |

FOREIGN PATENT DOCUMENTS

| | | |
|---|---|---|
| DE | 3923545 | 1/1991 |
| DE | 4240447 | 9/1993 |
| DE | 4429048 | 2/1996 |
| GB | 2273168 | 6/1994 |

OTHER PUBLICATIONS

Office Action in DE102007003230.9 dated Apr. 19, 2010.

* cited by examiner

*Primary Examiner* — Wesley Kim
*Assistant Examiner* — Richard Chan
(74) *Attorney, Agent, or Firm* — Benner & Witcoff, Ltd.

(57) ABSTRACT

According to one aspect, a method is provided for determining a state of a receiver on a transmission line. The method may comprise, for example, evaluating a first voltage arising at a circuit point between an impedance and a transmission line coupled to the impedance, wherein the impedance is coupled between a transmitter and the receiver, and determining a state of the receiver based on the first voltage. According to further aspects, various apparatuses are provided for performing this and other methods.

24 Claims, 4 Drawing Sheets

DETERMINING A STATE OF A RECEIVER ON A TRANSMISSION LINE

CROSS-REFERENCE TO RELATED APPLICATIONS

This application claims priority to German patent application no. 10 2007 003 230.9, filed Jan. 22, 2007, hereby incorporated by reference as to its entirety.

BACKGROUND

Particularly for operation of a transmission apparatus, certain information about a state of a corresponding receiver of the transmission apparatus may be important. By way of example, the operation of the transmission apparatus may be dependent on a state which is dependent on whether or not the receiver is electrically connected to the transmission apparatus.

SUMMARY

Various aspects are described herein. For example, according to one aspect, a method is provided for determining a state of a receiver on a transmission line. The method may comprise, for example, evaluating a first voltage arising at a circuit point between an impedance and a transmission line coupled to the impedance, wherein the impedance is coupled between a transmitter and the receiver, and determining a state of the receiver based on the first voltage. Various apparatuses for performing this and other methods are also described.

These and other aspects will be described with reference to the figures and various illustrative embodiments in the Detailed Description.

BRIEF DESCRIPTION OF THE DRAWINGS

Various aspects of the present invention are explained below using exemplary embodiments with reference to the appended drawings.

DETAILED DESCRIPTION

Figure 1:
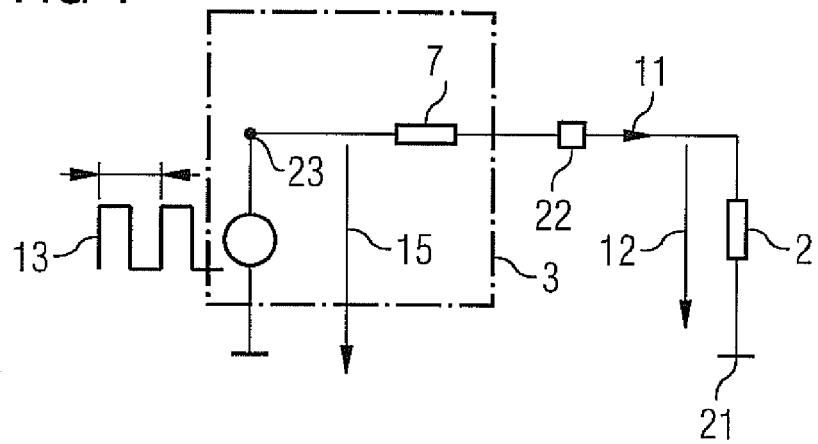
FIG. 1 shows a schematic of an illustrative circuit that determines a state of a receiver using a voltage divider.

Some aspects of the present invention provide a method for determining a state of a receiver on a transmission line. For example, the receiver may be electrically connected to a transmitter via the transmission line or, if the receiver is not electrically connected to the transmitter, parasitic impedances remain as a load for the transmitter. To determine the state of the receiver, a predetermined impedance may be arranged between the transmission line and the transmitter, so that a current which flows from the transmitter to the receiver (or the parasitic impedances) flows through this predetermined impedance or reference impedance. At a circuit point on the transmission line between the reference impedance and the receiver (or the parasitic impedances), a voltage which drops across the receiver (or the parasitic impedances) may be evaluated. This voltage may be taken as a basis for determining the state of the receiver.

It should be pointed out that a state may also be determined in which the receiver is not connected to the transmitter and hence to the circuit point. In this case, the circuit point can naturally nevertheless be envisaged between the reference impedance and the unconnected receiver, so that the circuit point in this case is an output of the transmitter which is connected only to the parasitic impedances.

As a result of the state of the receiver being determined by evaluating the voltage drop across this receiver (or the parasitic impedances), the method may be kept very simple and may therefore advantageously be implemented in a microelectronic circuit without necessarily using external components (components which are not implemented within the microelectronic circuit), for example.

For example, the voltage drop across the receiver can be generated by means of an electric current which has a predetermined frequency and flows through a series circuit comprising the reference impedance and an impedance which is formed by the connected or unconnected receiver.

The impedance formed by the receiver may change on the basis of the state of the receiver. As a result of the transmitter then sending the current through the reference impedance to the receiver, for example, the voltage may be evaluated to determine the impedance and hence to determine the state of the receiver. If the receiver is not connected to the transmitter, the impedance, which may be seen from the transmitter, may naturally have a measurably different value from when the receiver is connected to the transmitter. If the receiver is not electrically connected to the transmitter, the impedance, which may be seen from the transmitter or which the receiver forms for the transmitter, may be formed by the parasitic impedances already mentioned above, which means that the current in this case flows via these parasitic impedances and thereby forms the voltage measured at the circuit point. By selecting the predetermined frequency of the current, a parameter may be advantageously obtained which may be used to influence the voltage on the basis of the impedance.

In some embodiments, the current produced is in the form of a square-wave signal.

A potential advantage of the square-wave signal is that it may be generated using a relatively simple electronic circuit. By way of example, a square-wave signal can be generated merely by periodically opening and closing a switch. By contrast, it is typically much more complex to generate a sinusoidal current profile, for example, using a electronic circuit.

To evaluate the voltage across the receiver or across the parasitic impedances, the amplitude of the voltage may evaluated, for example. In this case, this evaluation of the amplitude may involve evaluation of, for instance, a root-mean-square (rms) value of the voltage. The evaluation of the amplitude or an amplitude profile of the voltage may then also involve a plurality of measurements of the voltage. By way of example, this may be desirable when a check is to be performed to determine whether or not the maximum value of the alternating current (AC) or pulsed voltage still exceeds a reference voltage, since the voltage, even if its maximum value does exceed the reference value, may be periodically below the reference value, for example at a zero crossing in the amplitude profile. In other words, an output of a comparator which compares the voltage with a DC voltage reference value would continually change its value in a situation in which the maximum value of the voltage is above the reference value, whereas the output would retain its value in a situation in which the maximum value of the voltage is not above the reference value.

The amplitude of the AC voltage which is generated by the current of the predetermined frequency may advantageously be evaluated in a simple manner using known or other methods, the evaluation being much simpler than having to evaluate the time profile of the AC voltage, for example.

In line with the invention, the state of the receiver can also be determined by evaluating the voltage on the circuit point a plurality of times, the current which flows in the direction of the receiver having a different predetermined frequency upon each evaluation. In this case, each evaluation involves the amplitude of the voltage on the circuit point and hence across the receiver or across the parasitic impedances being evaluated.

By performing a plurality of evaluations, it may be advantageously also possible to distinguish between states which could be distinguished only with difficulty if there were just one evaluation at a predetermined frequency, for example.

In further embodiments, the current may be generated by a further voltage which may also have a predetermined frequency so as thereby to generate the current at the predetermined frequency. In this case, the receiver may be arranged between a first circuit point and a second circuit point when the receiver is electrically connected to the transmitter, and otherwise parasitic impedances are present between the first circuit point and the second circuit point. The second circuit point then corresponds to the circuit point mentioned above. A third circuit point and the second circuit point may have the reference impedance between them, and the voltage may be evaluated between the second circuit point and the first circuit point on the basis of the further voltage which is present between the third circuit point and the first circuit point.

In this context, the concept of the voltage divider may be applied, which comprises the reference impedance and the impedance to be measured at the output between the first and the second circuit point, in order to determine the state of the receiver.

The state of the receiver may be used to ascertain whether or not the receiver is electrically connected to the transmitter via the transmission line and is activated or switched on. In this case, the evaluation of the voltage across the receiver (when the receiver is connected) or across the parasitic impedances (when the receiver is not connected) may distinguish between a first impedance value that is present when the receiver is connected and activated, and a second impedance value that is present when the receiver is either not connected or not activated. In other words, the first impedance value essentially corresponds to the impedance of the activated receiver and the second impedance value essentially corresponds to the impedance of the deactivated receiver or to the parasitic impedances.

In addition, the state of the receiver may be used to ascertain whether the receiver is switched off or deactivated or whether it is not connected. In this case, the evaluation of the voltage across the receiver again distinguishes between two impedance values, with one impedance value corresponding to the impedance of the deactivated but connected receiver and the other impedance value corresponding to the impedance of the unconnected receiver.

It therefore may be advantageously possible to implement a relatively simple evaluation of the voltage to distinguish between the following states of the transmitter:

The receiver is not electrically connected to the transmitter.

The receiver is electrically connected to the transmitter and is switched on.

The receiver is electrically connected to the transmitter but is not switched on.

Thus, a transmitter-end check may be performed to determine whether an operational receiver is present at the other end (the output end from the transmitter) of a cable.

To be able to distinguish between two predetermined impedance values, it may be desirable to select the predetermined frequency and/or the reference impedance such that the distinction through the evaluation of the voltage may be more reliable.

If, by way of example, it is known what impedance value is measured between the first and the second circuit point when the receiver is electrically connected to the transmitter and is activated and what impedance value is measured between the first and the second circuit point when the receiver is either not electrically connected to the transmitter or deactivated, the predetermined frequency and/or the reference impedance can be chosen such that the voltage measured between the first and the second circuit point differs in significant dependence on whether the receiver is electrically connected to the transmitter and is activated or whether this is not the case.

If the voltage is evaluated using the amplitude, the predetermined frequency and/or the reference impedance can be chosen such that there is a large or even maximum magnitude of difference between a first amplitude, which is measured when the impedance between the first and the second circuit point has a first impedance value, and a second amplitude, which is measured when the impedance between the first and the second circuit point has a second impedance value. This may be accordingly an opportunity to select the reference impedance and/or the predetermined frequency such that it is possible to reliably distinguish between two impedance values in optimum fashion.

The greater the difference between the first amplitude and the second amplitude, the easier it may be to distinguish between these two amplitudes and the simpler the circuitry may be for doing this, for example using a basic comparator.

Determining the state of the receiver may also allow particular properties of the receiver to be detected other than simple connection/disconnection of the receiver. For example, these properties may be attributed to aging of the receiver, corrosion of the receiver, alteration on account of overload during operation and/or soiling of the receiver, and thus these properties may additionally or alternatively be detected from the transmitter.

Various apparatuses may be provided for implementing the above-discussed methods for determining the state of the receiver. The receiver, when connected to the apparatus, may be electrically connected to a transmitter via a transmission line. A reference impedance for the apparatus may be arranged on the transmission line between the transmitter and the receiver (or parasitic impedances if the receiver is not connected). To determine the state of the receiver, which also includes a state in which the receiver is not electrically connected to the apparatus, the apparatus may evaluate a voltage on a circuit point which is arranged between the reference impedance and the receiver (or parasitic impedances if the receiver is not electrically connected to the apparatus). On the basis of this evaluation, the apparatus may then determine the state of the receiver.

In some embodiments, the apparatus may comprise a current generation apparatus and a voltage output which outputs a voltage at a predetermined frequency and has its input electrically connected to the current generation apparatus. For example, the current generation apparatus may be constructed from a series circuit comprising an amplifier and the reference impedance. The current generation apparatus therefore amplifies the voltage at the predetermined frequency, with which it is provided by the voltage output, and generates the current using this amplified voltage.

These embodiments describe what may be a relatively simple apparatus in order to allow a current at a predetermined frequency to flow through the receiver or the parasitic impedances so as to then evaluate the voltage across the receiver or the parasitic impedances and, as a result, to determine the state of the receiver. Apart from this, the reference impedance can be chosen such that the current is at a minimum when the state is determined, which means that the power consumption during the determination may be reduced or even minimized.

In particular, the receiver may be arranged between a first circuit point and a second circuit point in the apparatus, so that the second circuit point corresponds to the circuit point mentioned above. In this case, the current generation apparatus may generate the electric current such that it flows through the reference impedance and the receiver when the latter is connected, and otherwise flows through the parasitic impedances. The apparatus may comprise a voltage evaluation circuit which is supplied with the voltage between the first and the second circuit point and which evaluates this voltage. In this context, the apparatus may determine the state of the receiver on the basis of the evaluation by the voltage evaluation circuit.

The apparatus may also comprise a controller which is able to actuate the current generation apparatus such that the current generation apparatus is either switched off at high impedance or generates the electric current.

As a result of the current generation apparatus also being able to be switched to high impedance, the apparatus can be operated together with a transmitter, the transmitter and the apparatus being connected to the receiver (if present) via the transmission line. Following determination of the state of the receiver, for example, the apparatus may be then switched to high impedance and the transmission apparatus starts operating if the apparatus has determined that the receiver is connected.

The controller may also be in a form such that it determines the state of the receiver. To this end, an output of the voltage evaluation circuit is connected to an input of the controller, and the controller determines the state of the receiver on the basis of a value from this output or on the basis of a plurality of these values if a plurality of evaluations are performed.

In some embodiments, the controller may actuate the voltage output such that the controller prescribes the predetermined frequency possessed by the voltage which is output by the voltage output. For example, the controller may actuate the voltage output such that a plurality of voltages each at a respective predetermined frequency are set. For each of these voltages, the controller may store the value of the output of the voltage evaluation circuit and determine, after all values for all predetermined frequencies are determined, the state of the receiver on the basis of these values.

By way of example, the voltage evaluation circuit may be a comparator which compares the voltage between the first and the second circuit point with a predetermined reference voltage. In this case, the comparator may be in a form such that it compares the present voltage value with a reference value or such that it compares an rms value of the voltage with a reference rms value.

If, by way of example, a decision is to be made regarding which of two states exists, the reference voltage is advantageously chosen such that it is precisely between the two voltages (e.g. voltage amplitudes) which are measured for one and the other of the two states. This may produce a simple voltage evaluation circuit which can easily be constructed in a microelectronic circuit.

A circuit may further be provided which comprises a driver stage and a apparatus for determining the state of the receiver. In this case, both the driver stage and the apparatus may be connected to the receiver when it is connected, and otherwise to the parasitic impedances.

The apparatus may allow the circuit to determine the state of the receiver, which may also include a state in which the receiver is not connected to the circuit. This may allows the driver stage to be operated on the basis of this state.

For example, the circuit may switch the driver stage to high impedance or off when the apparatus is being operated and switches the current generation apparatus or inventive apparatus to high impedance or off when the driver stage is being operated.

As a result, it may be possible to reduce the possibility, or even prevent, the driver stage and the inventive apparatus from interfering with one another.

Should the driver stage be able to change the internal resistance and to generate the current at the predetermined frequency, then it may be possible to dispense with the apparatus altogether, since this functionality may be then undertaken by the driver stage.

As the term is used herein, a receiver is understood to mean any apparatus which detects an electric current or voltage or change thereof. Examples of such an apparatus are a sensor, a transmission apparatus and a reception apparatus.

The various embodiments as described herein may be used wherever it is desirable to test impedances, which may be direct current (DC) coupled or not, in a system in order to infer particular system properties from this test. In particular, the particular interface specifications (e.g. PCI Express) may be implemented without the need for external components (outside an electronic circuit) in order to do so. However, the present invention is not limited to this preferred area of application, and may also be used in other technologies, such as in automotive engineering and industrial electronics, in order to determine particular properties (aging, corrosion etc.), for example of sensors and actuators.

In this context, the a high level of interference immunity may be provided, as well as the capability of distinguishing between various impedances, for example in comparison with methods which distinguish voltages in the time domain.

Turning to the figures showing various illustrative embodiments, FIG. 1 schematically shows an example of how a state of a receiver 2 can be determined using a voltage divider. In this case, use is made of the fact that the state of the receiver 2 also alters an impedance which is measured between a first circuit point 21 (e.g., earth ground or another fixed potential) and a second circuit point 22. When an input voltage 15 is applied to a voltage divider (which is made up of an internal resistance 7 of a current generation apparatus 3 and the impedance of receiver 2) between a third circuit point 23 and the first circuit point 21, a voltage 12 between the second circuit point 22 and the first circuit point 21 is altered, the voltage essentially dropping across the receiver 2 or the impedance seen from the output of the current generation apparatus 3. In this case, the input voltage 15 is output at a predetermined frequency 13 by a voltage source in the current generation apparatus 3. It is therefore possible to use an evaluation of the voltage 12 to determine the impedance, and hence a state, of the receiver 2.

Figure 2:
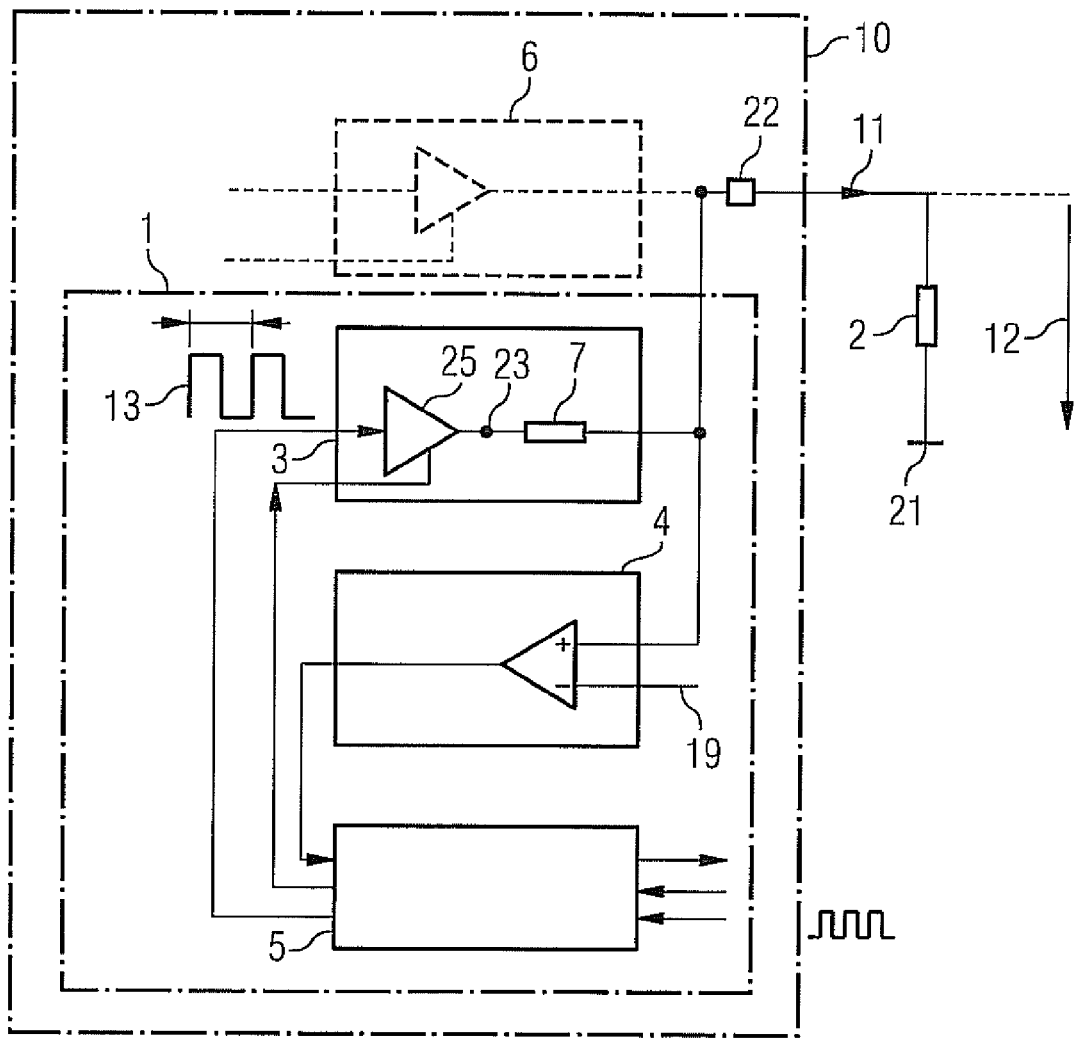
FIG. 2 shows a schematic of an illustrative circuit for determining a state of a receiver.

FIG. 2 shows an illustrative circuit 10 comprising a driver stage 6 and an apparatus 1 for determining the state of the receiver 2. As in FIG. 1, the receiver 2, when connected to the circuit 10, is electrically connected to the circuit 10 via the second circuit point 22 and is connected to earth or another fixed potential via the first circuit point 21. In this case, in normal operation of the circuit 10, the apparatus 1 is switched to high impedance, and when the state is determined the driver stage 6 is switched to high impedance.

The inventive apparatus 1 in this example comprises a current generation apparatus 3, a comparator 4 and a controller 5 with a voltage output. The controller 5 is supplied with an output of the comparator 4, a control signal and a clock. The controller 5 outputs a voltage at a predetermined frequency 13, which is derived from the clock, and a control signal to the current generation apparatus 3 and uses a further output signal to provide information about the determined state of the receiver 2. The current generation apparatus 3, which comprises a series circuit including an amplifier 25 and an internal resistance 7, amplifies the voltage applied to the input at the predetermined frequency 13 using the amplifier 25, so that the voltage which is output by the amplifier 25 is applied between a third circuit point 23 and earth or the first circuit point 21. The control signal allows the controller 5 to switch the amplifier 25 to high impedance. The second circuit point 22 is connected to an input of the comparator 4, and a second input of the comparator 4 has a reference voltage 19 applied to it. Finally, the output of the driver stage 6 is also connected to the second circuit point 22.

The voltage which is output by the amplifier 25 generates a current 11 which flows both through the internal resistance 7 and through an impedance 2, which essentially corresponds to the receiver 2 when the receiver 2 is connected to the circuit 10 and which corresponds to parasitic impedances when the receiver 2 is not connected to the circuit 10. A potential on the second circuit point 22 or a voltage between the second circuit point 22 and circuit point 21 therefore corresponds to the voltage 12 which is generated by the current 11 via the impedance 2. By virtue of this voltage 12 being compared with the reference voltage 19, a predetermined frequency 13 of the voltage which is output by the amplifier 25 and hence of the current 11 may make it possible to distinguish between two impedance values of the impedance 2 and hence between two states.

It should be noted that the reference symbol 2 in the present application denotes either the receiver or the impedance, which corresponds to a load impedance which, seen from the circuit 10, is situated between the first and the second circuit point 21, 22. The reason for this is that the impedance may be formed by the receiver when the receiver is connected to the circuit 10.

Figure 3A:
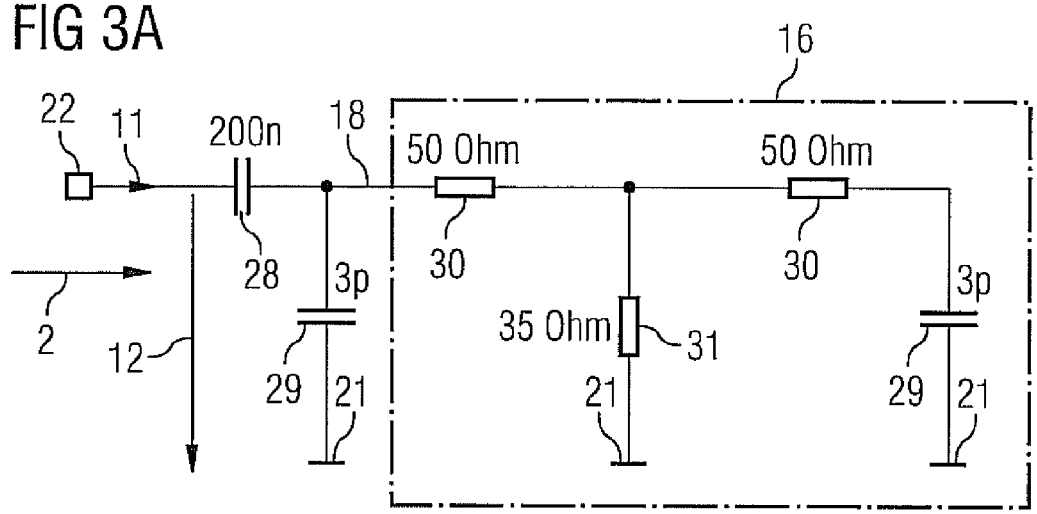
FIGS. 3A, 3B, and 3C show three different illustrative states of a connected or unconnected receiver.
Figure 3B:
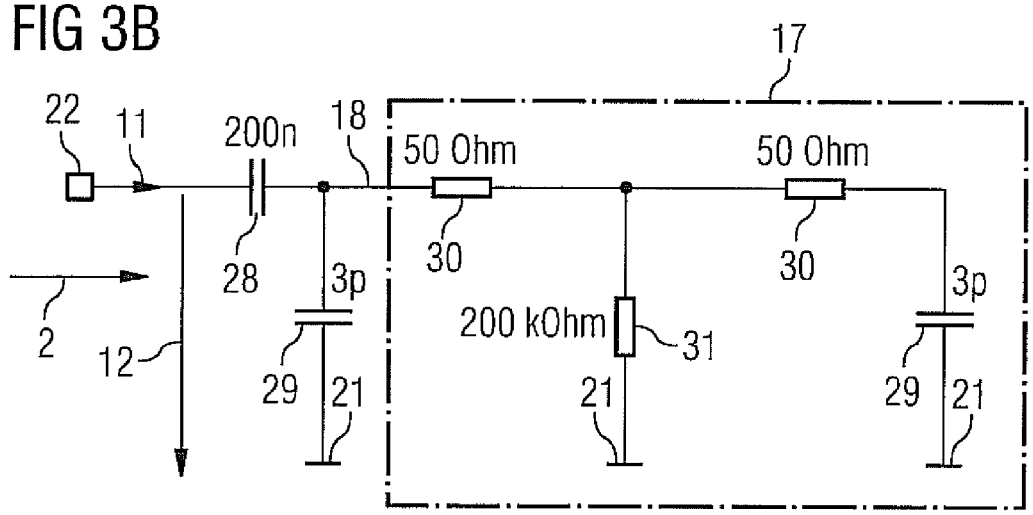
Figure 3C:
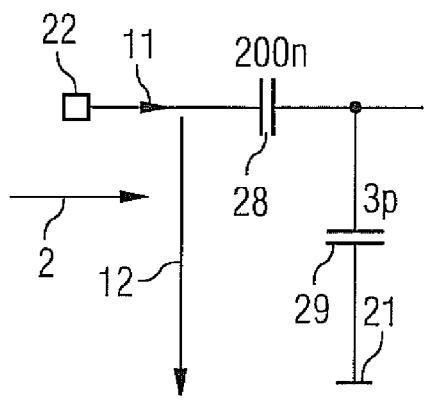

FIGS. 3A-3C show three different illustrative states which can be determined using the inventive apparatus 1 shown in FIG. 2 or between which it may be possible to distinguish using the inventive apparatus 1.

In this example, reference symbol 16 in FIG. 3A shows an equivalent circuit for a receiver 2 which is electrically connected to the second circuit point 22 and which is switched on. In this arrangement, this equivalent circuit 16 comprises a first resistor 30 which is connected to the second circuit point 22 via a coupling capacitor 28, which has been ignored in the above. The other end of the first resistor 30 is connected to a second resistor 31, whose other end is connected to circuit point 21, and to a third resistor 30, which is connected to circuit point 21 via a parasitic impedance 29. Finally, there is yet another parasitic impedance 29 between the first resistor 30 and circuit point 21. The arrow 2 on the left-hand side is intended to indicate that this equivalent circuit 16 together with the coupling capacitance 28 and the further parasitic impedance 29 forms an impedance 2, which is seen from the circuit 10 or apparatus 1 shown in FIG. 2 between the first circuit point 21 and the second circuit point 22 and is essentially formed by the receiver 2.

In FIG. 3B, a reference symbol 17 shows an equivalent circuit for a receiver which is electrically connected to the second circuit point 22, the receiver not being switched on, however, which is why the resistance value of the second resistor 31 has changed accordingly in comparison with the equivalent circuit 16, the equivalent circuit 17 in FIG. 3B otherwise corresponding to the equivalent circuit 16 in FIG. 3a).

FIG. 3C shows a state or instance in which the receiver 2 is not electrically connected to the circuit point 22 or to the circuit 10 or apparatus 1. In this case, the impedance 2 between the first circuit point 21 and the second circuit point 22 is formed only by the coupling capacitance 28 and the further parasitic impedance 29.

Figure 4:
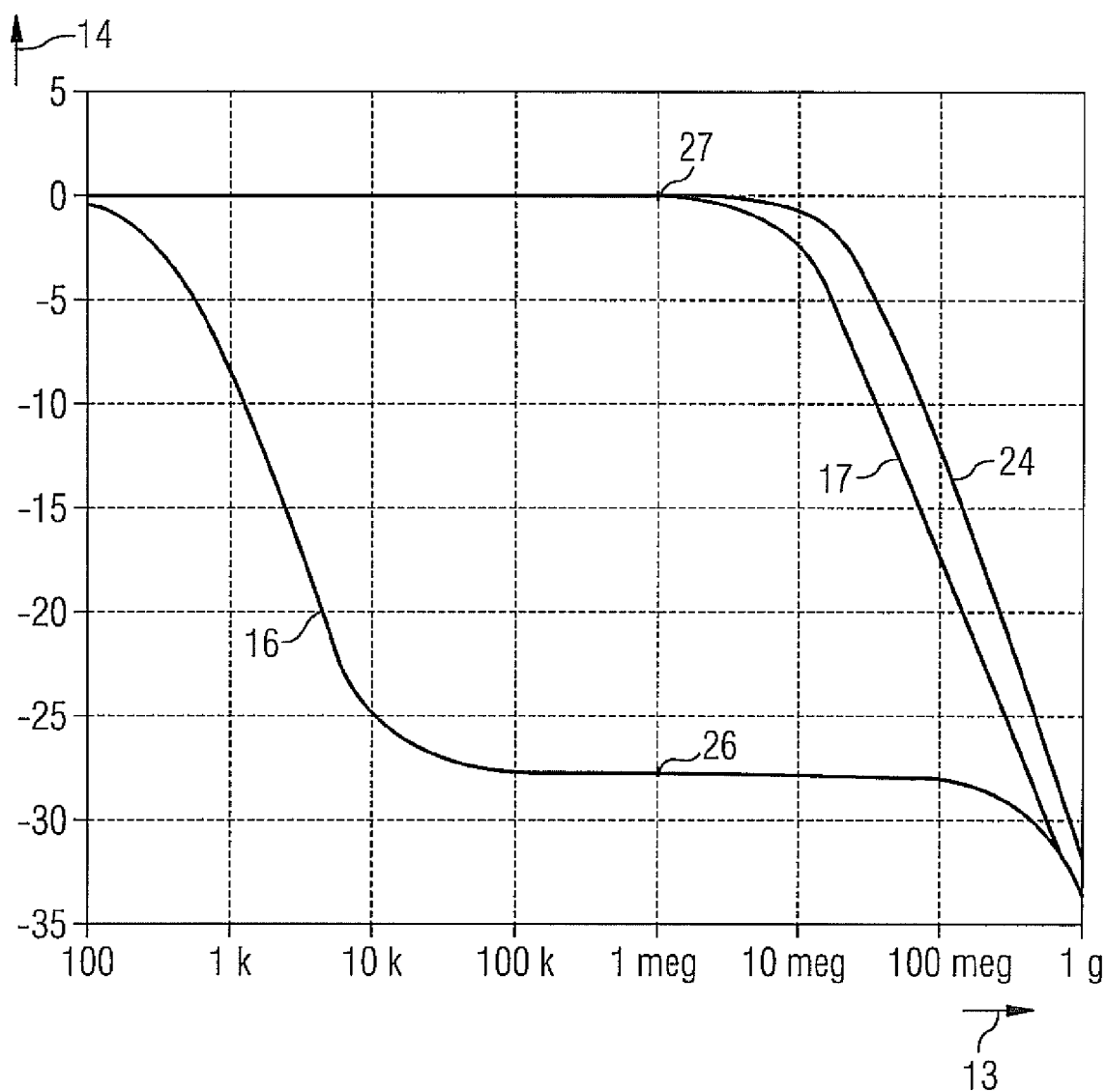
FIG. 4 shows an illustrative frequency-dependent profile for a voltage for the three states shown in FIGS. 3A-3C.

FIG. 4 shows a graph of an illustrative frequency-dependent profile for the voltage 12 for the states 16, 17, and a state 24 that corresponds to FIG. 3C, when the internal resistance 7 is selected to be 2 k ohms (for example). It can be seen in this example that, at high and at low frequencies, differences between a first state "receiver is connected and switched on" 16 and a second state "receiver is either not connected or not switched on" 17, 24 are small, which means that it may be difficult to reliably distinguish between these two states. In the frequency range of approximately 10 kHz to 10 MHz, however, the difference is more significant in this example. At approximately 1 MHz, the voltage 12 on the second circuit point 22 in the first state 16 is only approximately 1/20th of the voltage 12 in the second state 17, 24. So as to be able to more reliably distinguish between these two states 16 and 17, 24, therefore, the predetermined frequency in this example may be chosen in the frequency range of 10 kHz to 10 MHz.

To ascertain the predetermined frequency 13, which is good or even optimum for distinguishing between the first state 16 and the second state 17, 24, the voltage profile shown in FIG. 4 may be examined to determine the frequency 13 at which a first voltage amplitude 26 of the voltage in the first state 16 has a maximum or at least threshold difference from a second voltage amplitude 27 in the second state 17, 24. The frequency ascertained in this manner may then be chosen as the predetermined frequency 13.

By contrast, under the conditions described previously, a frequency range of 10 MHz to 1 GHz, for example a frequency around 100 MHz, may be advantageous in this example to distinguish between the state "receiver is connected but not switched on" 17 and the state "receiver is not connected" 24, since in this case a voltage difference between the two states is approximately a factor of two (although a factor of two is not necessary in order to distinguish between the states).

Thus, to determine which of the three states 16, 17, 24 shown in FIGS. 3A-3C is present at any given time, the apparatus 1 shown in FIG. 2 may perform two evaluations, for example, with the first evaluation involving the predetermined frequency 13 being set to a first frequency such as 1 MHz and the second evaluation involving the predetermined frequency 13 being set to a different second frequency such as 100 MHz. On the basis of the two outputs from the comparator 4 for these two evaluations, the controller 5 would then output which of the three states 16, 17, 24 is determined by the apparatus 1.

In addition, it may be possible to determine which of the three states 16, 17, 24 shown in FIGS. 3A-3C is present using two evaluations, where the same predetermined frequency (e.g., 100 MHz) is used in each case. So as then to be able to distinguish between the three states 16, 17, 24, the reference voltage 19 may be chosen differently for the two evaluations, so that one evaluation would be used to distinguish between the state 26 and the states 17, 24 and the other evaluation would be used to distinguish between the states 17, 26 and the state 24. On the basis of the two outputs from the comparator 4 for these two evaluations, the controller 5 may then output which of the three states 16, 17, 24 is determined by the apparatus 1.

Figure 5:
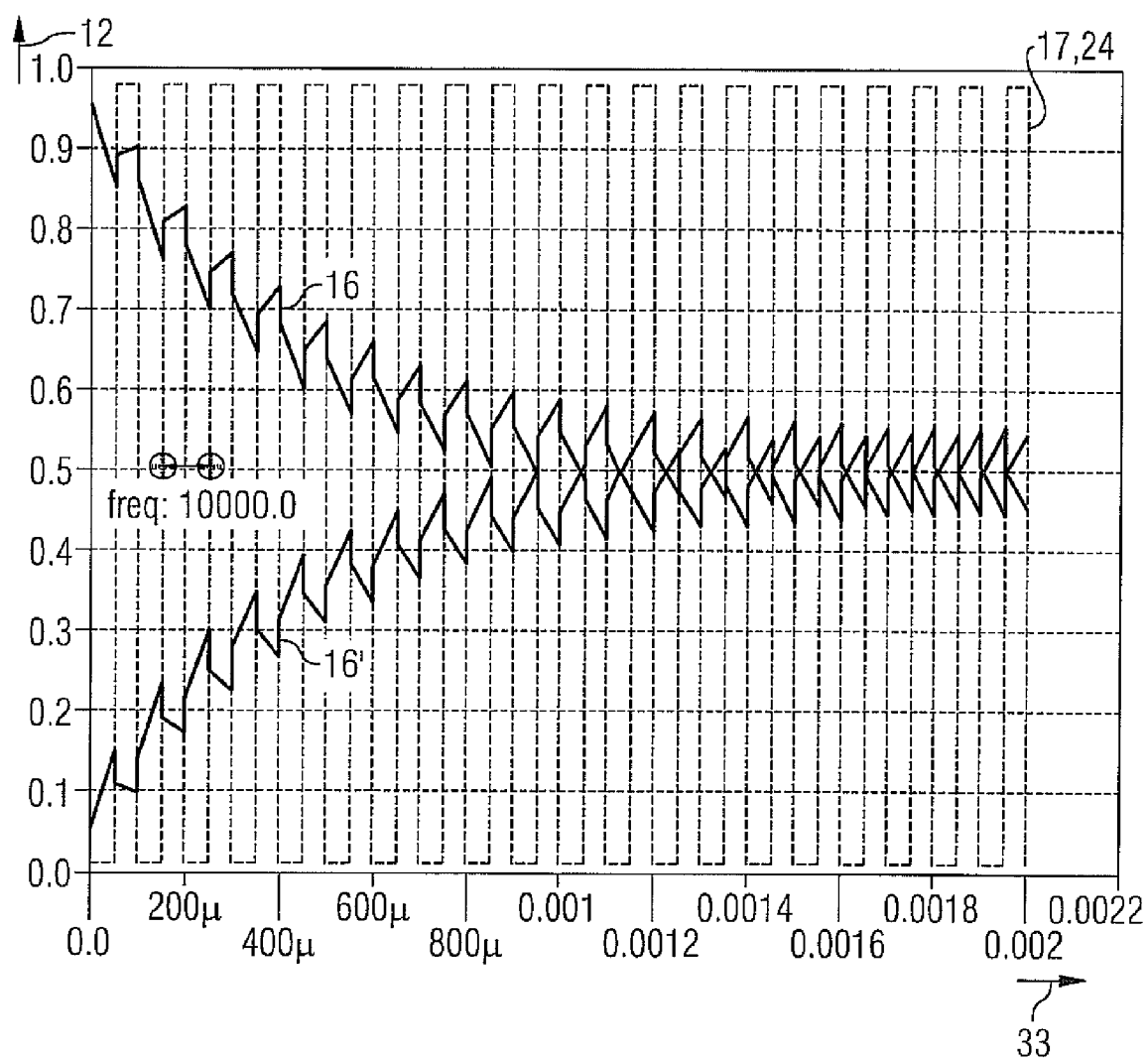
FIG. 5 shows an illustrative time profile for the voltage for the states shown in FIGS. 3A-3C in the case of square-wave excitation.

FIG. 5 shows the time profile of an example of voltage 12 for the first state 16 (solid line) and the second state 17, 24 (dashed line) when the voltage 15 is switched on as a square wave at a fundamental frequency of 10 kHz. It can be seen that the voltage amplitude for the second state 17, 24 more or less does not change, whereas for the first state 16, 16' involves a transient process being followed by the appearance of an average for the voltage amplitude that corresponds to half the voltage amplitude in the case of the second state 17, 24. In this case, the curve denoted by the reference symbol 16 shows an example in which the square-wave current 11 starts with a falling edge, whereas the curve shown by the reference symbol 16' represents an example in which the square-wave current 11 starts with a rising edge. In other words, the curve denoted by 16 represents clocking which is the inverse of clocking for the curve denoted by 16'.

With a suitable choice of reference voltage 19, the comparator 4 (see FIG. 2) does not switch again when the transient process has died down in the first state 16, 16', provided that the comparator 4 reacts to a voltage value and not an rms value, whereas the comparator 4, in contrast to this, would continue to switch continually in the second state 17, 24. This difference is determined by the controller 5, so that the relevant output of the controller 5 can distinguish between the first state 16, 16' and the second state 17, 24, which means that it may be possible to establish whether or not an operational receiving end exists.

The methods and apparatuses described above may be more robust in comparison with method and apparatuses in which the state is determined by evaluating a time profile for the voltage, since only amplitudes are measured and it is not a question of time constants. As a result, the methods and apparatuses described previously may allow interference to be partially or fully suppressed through averaging, which means that the inventive methods and apparatuses may be less sensitive to interference, whereas the same interference may result in misinterpretations in the case of a method operating in the time domain.

The above-described methods and apparatuses may also allow the current 11 to be generated sinusoidally at a precisely known frequency 13. A sinusoidal current 11 may also allow states or impedances 2 to be distinguished that a time-domain-based method may be almost unable to distinguish. This may apply for example where the impedance 2 also has inductive components which result in oscillations in the time domain.

Furthermore, the above-described inventive aspects may allow an appropriately considerable number of evaluations performed with a particular frequency spacing when there are an appropriately large number of different predetermined frequencies in a frequency range, to be used to ascertain support points for an amplitude/frequency response for the voltage 12 and to take these support points as a basis for determining the state of the receiver.

The invention claimed is:

1. A method for determining a state of a receiver on a transmission line, comprising:

evaluating a first voltage arising at a circuit point between a transmitter and a transmission line, wherein the first voltage arises from a first current having a first predetermined frequency generated by the transmitter through a load impedance of the receiver serially coupled to the transmitter through the transmission line;

determining, based on the first voltage, a state of the receiver, wherein the load impedance changes based on the state of the receiver;

switching an output of a driver coupled to the transmission line to high impedance during the evaluating of the first voltage; and switching an output of the transmitter coupled to the transmission line to a high impedance when not evaluating the first voltage.

2. The method of claim 1, wherein the first current is a square-wave signal oscillating at the first predetermined frequency.

3. The method of claim 1, further comprising:

generating with the transmitter a second current having a second predetermined frequency through the load impedance and the transmission line;

evaluating a second voltage arising as a result of the second current at the circuit point between the transmitter and the transmission line; and determining the state of the receiver based on the first voltage and the second voltage.

4. The method of claim 1, wherein the receiver includes a sensor configured to detect a change in a voltage or current on the transmission line.

5. A method for determining a state of a receiver on a transmission line, wherein the receiver is coupled between a first circuit point and a second circuit point of the transmission line, the method comprising:

sending a first current of a first frequency through the receiver and through a reference impedance serially coupled with the receiver between a third circuit point of the transmission line and the second circuit point, a first voltage across the first circuit point and the second circuit point arising as a result of the first current;

evaluating a second voltage that arises between the third circuit point and the second circuit point as a result of the current; and determining a state of the receiver based on the second voltage.

6. The method of claim 5, wherein the evaluating of the second voltage comprises determining whether a maximum amplitude of the second voltage exceeds a predetermined threshold, and the determining of the state of the receiver comprises distinguishing between first and second states of the receiver based on whether the maximum amplitude of the second voltage exceeds the predetermined threshold.

7. The method of claim 5, wherein the sending comprises sending the first current at the first frequency and at a second frequency sequentially, and the evaluating of the second voltage comprises evaluating amplitudes of the second voltage that arise as a result of the first voltage at both the first and second frequencies.

8. An apparatus, comprising:

an amplifier configured to generate at an output of the amplifier a voltage signal having a first predetermined frequency;

a reference impedance serially coupled between the output of the amplifier and an apparatus output;

a comparator having a first input coupled to the apparatus output and a second input coupled to a reference voltage, the comparator configured to compare a voltage of the apparatus output with the reference voltage; and a controller configured to control a state of the amplifier, to receive an output of the comparator, and to generate a first signal based on the output of the comparator, wherein the first signal indicates the state of a receiver having a load impedance serially coupled to the apparatus output through a transmission line, wherein the load impedance depends upon the state of the receiver, and wherein the voltage of the apparatus output depends upon the voltage signal having the first predetermined frequency, the reference impedance, and the load impedance, wherein the controller is further configured to cause the voltage signal to be at the first predetermined frequency and then at a second predetermined frequency, and to generate the first signal based on the output of the comparator that is generated while the voltage signal is at the first and second predetermined frequencies.

9. The apparatus of claim 8, further comprising:
the transmission line; and
the receiver, wherein the receiver includes a sensor configured to detect a change in a voltage or current received on the transmission line.

10. The method of claim 1, wherein the determining of the state of the receiver includes distinguishing between: a first value of the load impedance corresponding to the receiver being connected to the transmission line and deactivated, and a second value of the load impedance corresponding to the receiver being connected to the transmission line and activated.

11. The method of claim 5, wherein the determining of the state of the receiver includes distinguishing between: a first value of the load impedance corresponding to the receiver being connected to the transmission line and deactivated, and a second value of the load impedance corresponding to the receiver being connected to the transmission line and activated.

12. The apparatus of claim 8, wherein the controller is configured to control the amplifier between a state of generating the voltage signal and a state of high impedance.

13. The method of claim 4, wherein the state of the receiver is a state chosen from the group consisting of: aging of the receiver, corrosion of the receiver, alteration on account of overload during operation, and soiling of the receiver.

14. The method of claim 1, further comprising, generating the first current by transmitting with the transmitter a signal derived from a clock oscillating at the first predetermined frequency.

15. The method of claim 14, wherein the signal is a sinusoidal signal oscillating at the first predetermined frequency.

16. The method of claim 10, wherein the determining of the state of the receiver includes distinguishing between: the first value of the load impedance, the second value of the load impedance, and a third value of the load impedance corresponding to the receiver being disconnected from the transmission line.

17. The method of claim 1, wherein the determining includes distinguishing between three states of the receiver corresponding to three different values of the load impedance, wherein the three states include an on state, an off state, and a disconnected state.

18. The method of claim 2, further comprising:
generating the square wave signal by periodically opening and closing a switch.

19. The method of claim 3, further comprising:
determining the state of the receiver by selecting between a first receiver state and a second receiver state based on evaluating the first voltage at the first predetermined frequency; and
determining the state of the receiver by selecting between the second receiver state and a third receiver state based on evaluating the second voltage at the second predetermined frequency.

20. The method of claim 1, wherein the determining includes:
averaging the first voltage over a time period; and
comparing the averaged first voltage to a predetermined value.

21. The method of claim 4, wherein the sensor is configured to receive a PCI Express interface signal.

22. The method of claim 1, further comprising sending, by the transmitter, a first current of the first predetermined frequency through the load impedance and through the transmission line.

23. An apparatus for determining a state of a receiver on a transmission line, the apparatus comprising:
a comparator configured to evaluate a first voltage arising at a circuit point between a transmitter and a transmission line, wherein the first voltage arises from a first current having a first predetermined frequency generated by the transmitter through a load impedance of the receiver serially coupled to the transmitter through the transmission line; and
a controller configured to determine, based on the first voltage, a state of the receiver, wherein the load impedance is configured to change based on the state of the receiver,
wherein the apparatus is configured to:
switch an output of a driver coupled to the transmission line to high impedance while the comparator evaluates of the first voltage, and
switch an output of the transmitter coupled to the transmission line to a high impedance while the comparator is not evaluating the first voltage.

24. An apparatus for determining a state of a receiver on a transmission line, wherein the receiver is coupled between a first circuit point and a second circuit point of the transmission line, the apparatus comprising:
circuitry configured to send a first current of a first frequency through the receiver and through a reference impedance serially coupled with the receiver between a third circuit point of the transmission line and the second circuit point, and to cause a first voltage across the first circuit point and the second circuit point to arise as a result of the first current; and
a controller configured to evaluate a second voltage that arises between the third circuit point and the second circuit point as a result of the current and to determine a state of the receiver based on the second voltage.

* * * * *